United States Patent [19]

Wilcox et al.

[11] Patent Number: 5,130,988
[45] Date of Patent: Jul. 14, 1992

[54] SOFTWARE VERIFICATION BY FAULT INSERTION

[75] Inventors: Philip S. Wilcox; Gudmundur A. Hjartarson, both of Nepean; Robert A. Hum, Stittsville, all of Canada

[73] Assignee: Northern Telecom Limited, Montreal, Canada

[21] Appl. No.: 583,208

[22] Filed: Sep. 17, 1990

[51] Int. Cl.⁵ ............................................. G01R 31/28
[52] U.S. Cl. ........................................ 371/22.3; 371/3; 371/23
[58] Field of Search .................... 371/22.3, 3, 23, 22.1

[56] References Cited

U.S. PATENT DOCUMENTS 4,669,081  5/1987  Mathewes, Jr. et al. ............... 371/3
4,875,209  10/1989  Mathewes, Jr. et al. ............... 371/3

FOREIGN PATENT DOCUMENTS 0358376  5/1990  European Pat. Off. ............... 31/28
0377455  7/1990  European Pat. Off. ............... 31/318

OTHER PUBLICATIONS

IBM Technical Disclosure Bulletin vol. 31, No. 1, Jun. 1988, New York US pp. 127–128; 'Verification of error correction circuitry' see p. 128 line 8–131; figure.
"Bounday Scan A Framework For Structured Design-For-Test" by Colin Maunder and Frans Beenker, IEEE 1987 International Test Conference, Paper 30.1, pp. 714–723.
"Boundary Scan And Its Application To Analog-Digital ASIC Testing In A Board/System Environment" by Patrick P. Fasang, IEEE 1989 Custom Integrated Circuits COnference, 22.4.1–22.4.3.

Primary Examiner—Jerry Smith
Assistant Examiner—Henry C. Lebowitz
Attorney, Agent, or Firm—Thomas Adams

[57] ABSTRACT

An integrated circuit having boundary-scan facilities in accordance with IEEE Standard 1149.1, has its boundary scan chain configured to permit fault insertion testing of diagnostic and maintenance software. Each Scan cell includes storage devices for storing a pair of bits of a binary vector shifted into the boundary scan chain. One bit comprises faulty data and the other bit serves to control application of the faulty data by the scan cell. A system incorporating such integrated circuits includes a controller for controlling the IEEE test interface to shift the binary vector into the boundary scan chain, and diagnostic and maintenance software for diagnosing the faults introduced into the integrated circuits.

34 Claims, 3 Drawing Sheets

SOFTWARE VERIFICATION BY FAULT INSERTION

FIELD OF THE INVENTION

This invention relates to a method and apparatus for testing integrated circuits and systems or modules incorporating integrated circuits. The invention is especially applicable to fault insertion testing of diagnostic software in such systems of integrated circuits.

BACKGROUND

Increasing complexity of integrated circuits and increasing use of surface mount interconnection technology have led manufacturers of such integrated circuits to design them for easier testing using techniques such as the so-called "boundary scan" technique. It has been proposed to provide for standardized access to such integrated circuits for test purposes. The resulting standard, IEEE standard 1149.1, defines a standard serial bus access method employing the "boundary scan" technique which provides total control over an integrated circuit's input and output pins. This standard serial bus interface permits control of all of the integrated circuit's input/output operations, independently of the integrated circuit's function, and while the system is in its operating mode.

Boundary scan arrangements have been disclosed in the following papers: Colin Maundar and Frans Beenker, "BOUNDARY-SCAN: A Framework For Structured Design-For-Test," IEEE International Test Conference February 1987; Patrick P. Fasang, "Boundary Scan And Its Application To Analog-Digital ASIC Testing in a Board/System Environment," IEEE Custom Integrated Circuits Conference 1989.

Boundary scan integrated circuits compatible with IEEE 1149.1 comprise a scan cell in the signal path between each bonding pad or terminal and the core circuitry of the integrated circuit. In this specification, the term "core circuitry" refers to circuitry which is internal to the integrated circuit and which is to be tested. The scan cells are connected in series, i.e. in a chain, to a four wire interface known as the TAP interface, which permits access to the scan chain for testing purposes. The TAP interface comprises a series of shift registers, one to store instructions and the others to store test data to be used in accordance with those instructions. The scan chain comprises an external shift register connected between TAP interface ports.

Each scan cell comprises a storage device and a switch. In normal operation the switch connects the core circuitry to the pad or terminal to allow passage of normal functional signals. For test purposes, the switch connects the terminal pad or the core circuitry to the storage device. A reference binary vector stored in the chain of storage devices can thus be applied to the core circuitry or to the terminal pads of the integrated circuit.

This IEEE standard boundary scan design facilitates the testing of hardware, but is not entirely satisfactory for use when testing software, particularly diagnostic and maintenance software for monitoring the system's performance. Large and complex systems, such as telephone switches and data transmission equipment, have substantial portions of their operating software dedicated to maintenance and diagnostic functions. Typically, such systems are able to diagnose problems and, in some cases, initiate remedial action.

The maintenance and diagnostic software packages themselves are large, complex and vital systems. It is necessary to be able to test and verify the operation of these software packages. One way of doing so is to introduce faults deliberately into the hardware, see if they are detected and, where applicable, ensure that appropriate corrective action is taken. This procedure is known as "Fault Insertion". Clearly fault insertion must be done with the system in its normal operating configuration. Examples of fault insertion systems are disclosed in U.S. Pat. No. 4,669,081 dated May 26, 1987, inventors James K. Mathewes, Jr. et al and U.S. Pat. No. 4,875,209 dated Oct. 17, 1989, inventors James K. Mathewes, Jr. et al. Such fault insertion techniques generally are difficult to perform with adequate thoroughness in view of the size of the hardware systems involved (many thousands of nodes to which faults are to be applied) and the density of the packaging.

It is desirable to be able to use fault insertion testing in systems which employ IEEE standard 1149.1. Unfortunately, this is not possible because the IEEE standard 1149.1 boundary scan system does not easily permit individual input or output terminals of the integrated circuit to be accessed independently. Consequently, if a fault were to be inserted, all terminals would be affected and the integrated circuit would simply not function at all.

OBJECT OF THE INVENTION

An object of the present invention is to provide a testing arrangement for integrated circuits and/or for modules or systems including integrated circuits, which is compatible with the aforementioned IEEE standard 1149.1 but also facilitates fault insertion testing of associated software.

SUMMARY OF THE INVENTION

According to one aspect of the present invention, an integrated circuit comprises a test interface, a plurality of terminal pads, a corresponding plurality of scan cells each connected to a respective one of said plurality of terminal pads, and internal or core circuitry. Each scan cell comprises:

(i) an input and an output connected one to a terminal pad of the integrated circuit and the other to the core circuitry of said integrated circuit;

(ii) storage means for storing a pair of binary bits, one of the pair of bits comprising faulty data to be applied to the output of the scan cell, the other serving to enable application of the faulty data bit at the output of the scan cell, the storage means being connected, in series with the corresponding storage means of the remainder of the plurality of scan cells, between an input port and an output port of the test interface, the test interface including means for loading the binary vector into the series of storage means; and (iii) selector means responsive to a control signal (C), a trigger signal (T) and the aforesaid other of the pair of bits for selectively connecting either of said input of said scan cell and the output of said storage means to said output of said scan cell, the arrangement being such that application of said faulty value to said scan cell output is dependent upon the state of said other of said pair of bits.

A second aspect of the invention a system comprises at least one integrated circuit according to the first aspect in combination with means for controlling its test interface, such controller means being operable to provide at said test interface a control signal, a trigger signal and said binary reference vector, bits of said binary reference vector comprising, alternately, faulty data bits and control or enabling bits for controlling application of said faulty data by a said scan cell.

In preferred embodiments of the invention, the system includes means for diagnosing faulty data bits.

According to a third aspect of the invention, there is provided a method of testing an integrated circuit of the first aspect.

The method comprises the steps of:
(i) loading a binary vector into said series of storage means such that each individual storage means holds a pair of bits, one bit comprising faulty data and the other bit comprising an enabling bit, and controlling said selector means in dependence upon the state of said other bit of said pair of bits, to apply said faulty data bit to the output of said scan cell.

BRIEF DESCRIPTION OF THE DRAWINGS

An embodiment of the invention will now be described by way of example only and with reference to the accompanying drawings in which.

DETAILED DESCRIPTION OF A PREFERRED EMBODIMENT

Figure 1:
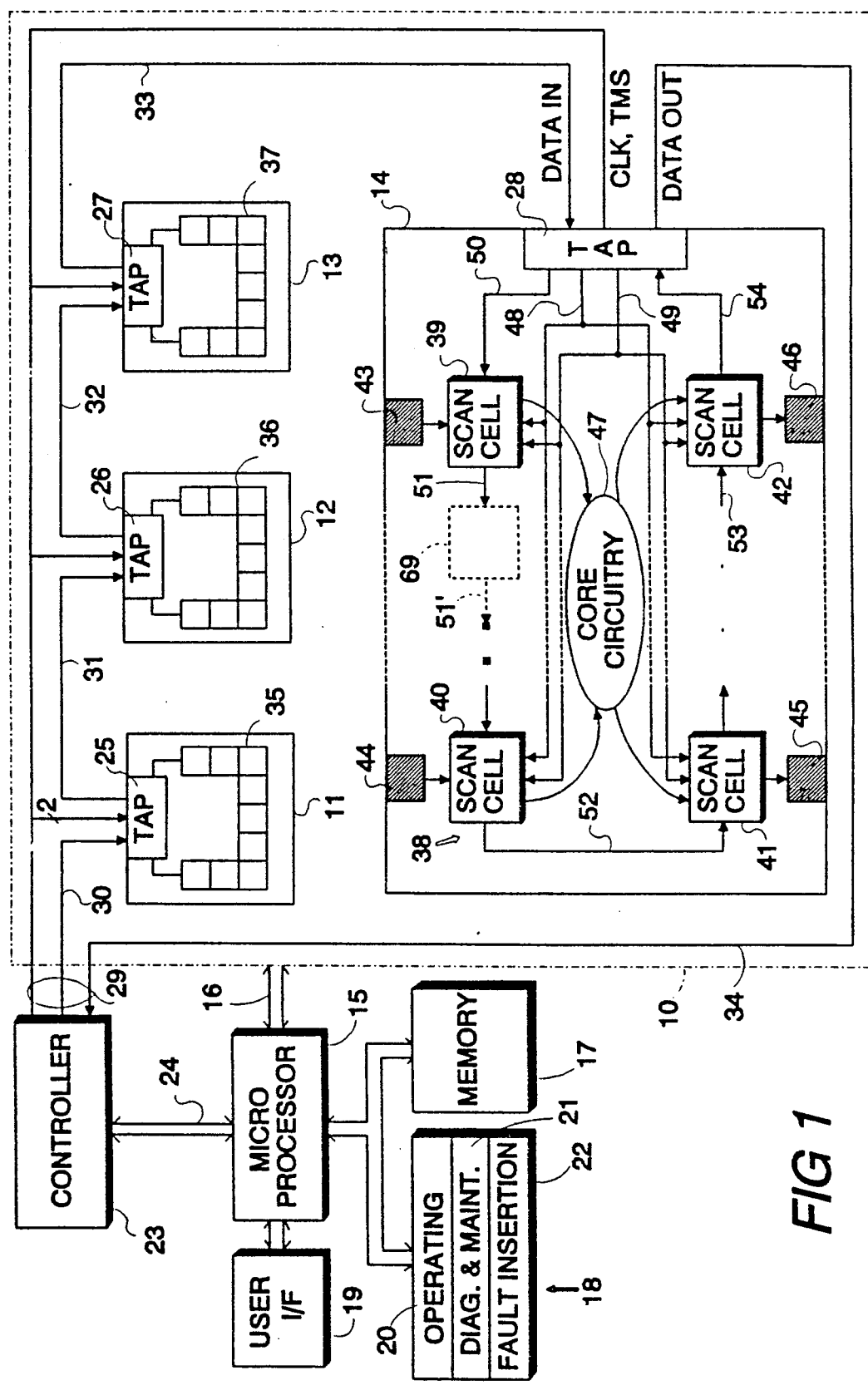
FIG. 1 is a schematic block diagram of a system comprising several integrated circuits grouped in a module each of the integrated circuits having scan cells for use in boundary scan testing purposes.

Referring now to FIG. 1, which is a much simplified illustration of a digital electronics system, a module 10 comprises four integrated circuits 11-14, respectively. Although only four are shown for the purposes of this description, there might be more, or fewer, in a typical system. The integrated circuits 11-14 are connected to a microprocessor 15 by way of a functional bus 16. The microprocessor 15 is connected to a memory 17, software store 18, and a user interface 19. The microprocessor 15 employs programs from store 18 to control the module 10 by way of functional bus 16. In operation, operating software 20 will control the normal operation of the system, for example to handle telephone calls. Diagnostic and maintenance software 21 will monitor the operation of the system, and possibly initiate remedial action if a fault occurs. Fault insertion software 22 will be employed, as described in more detail later, to test the operation of the diagnostic and maintenance software 21.

The microprocessor 15 is also connected to the module 10 by way of an IEEE 1149.1 test bus controller 23 to which it is connected by a bus 24. It will be appreciated that there will be various interconnections both between the integrated circuits and to other components of the system. To simplify the description, however, only connections relevant to the testing of the integrated circuits are shown.

A suitable test bus controller 23 and associated software are marketed as a package by Texas Instruments Inc. under the trade mark ASSET. The package comprises a card for insertion into a personal computer and software to allow the card to communicate with integrated circuits having a so-called TAP interface configured in accordance with IEEE Standard 1149.1. The integrated circuits 11-14 have TAP interfaces 25 to 28, respectively, each having clock, mode select, data in and data out ports. The TAP interfaces communicate with the test bus controller 23 by a four-wire bus 29.

A serial "scan" bus segment 30 connects a data output of test bus controller 23 to a data input of integrated circuit 11. Corresponding serial bus segments 31, 32, 33 and 34 connect the integrated circuits 11 to 14 in daisy-chain fashion to a data-in port of test bus controller 23. The TAP interfaces 25-28 each comprise shift registers connected between their data-in and data-out ports to receive data under the control of the clock (CLK) and mode select (TMS) signals. One of these shift registers is for storing instruction sequences from the test bus controller 23. The integrated circuits 11-14 have boundary scan chains of storage devices 35-38, respectively, also connected between the "data-in" and "data-out" ports of their TAP interfaces 25-28, respectively. Each of the scan chains 35-38 can be considered as an external shift register connected in the serial scan chain. Each of the TAP interfaces 25-28 has two basic modes of operation which are selected by toggling the mode select signal TMS from the test bus controller 23. In the first mode, an instruction sequence, including a control bit C and a trigger bit T, the purpose of which will become apparent later, are loaded into the instructions register in the TAP interface. In the second mode, test bus controller 23 shifts serial boundary scan data, i.e. a binary vector, into the scan chain by way of the serial bus segment 30 under the control of the clock signal CLK. The binary vector is then utilized in accordance with the stored instructions.

The precise composition of the binary vector will depend upon the system configuration and the positions at which the faults are to be inserted. The binary vector may be composed by the user and inserted by means of user interface 19. The diagnostic and maintenance software 21, if working correctly, will detect the faults and report them, and/or remedy them, in its usual way, which will not be described in detail here.

In FIG. 1, parts of integrated circuit 14, particularly components of its "boundary scan" chain 38, are shown in more detail. The boundary scan components comprise a plurality of scan cells 39, 40, 41 and 42 interposed between corresponding input/output pads 43, 44, 45 and 46, respectively, and core circuitry 47 of the integrated circuit 14. The pads 43 to 46 will be connected to terminals (not shown) which will connect the integrated circuit to external components in the usual way. Within the integrated circuit 14, the scan cells 39 to 42 are connected to the TAP interface 28 by a control signal bus 48 and a trigger signal bus 49.

In addition, the scan cells 39 to 42 are interconnected between the scan-in and scan-out ports of the TAP interface 28, in daisy-chain fashion, by serial scan bus segments 50, 51, 52, 53 and 54. (Other connections are not shown for simplicity of description.)

Although only four scan cells are shown, associated with input pads 43, 44 and output pads 45, 46, it will be understood that there will usually be far more since there will be one scan cell for each input or output pad of the integrated circuit. The input scan cells 39 and 40 are of identical construction. The output cells 41 and 42 are of identical construction but differ from the input cells 39 and 40 in the way in which they are connected to the associated pads and the core circuitry.

Figure 2:
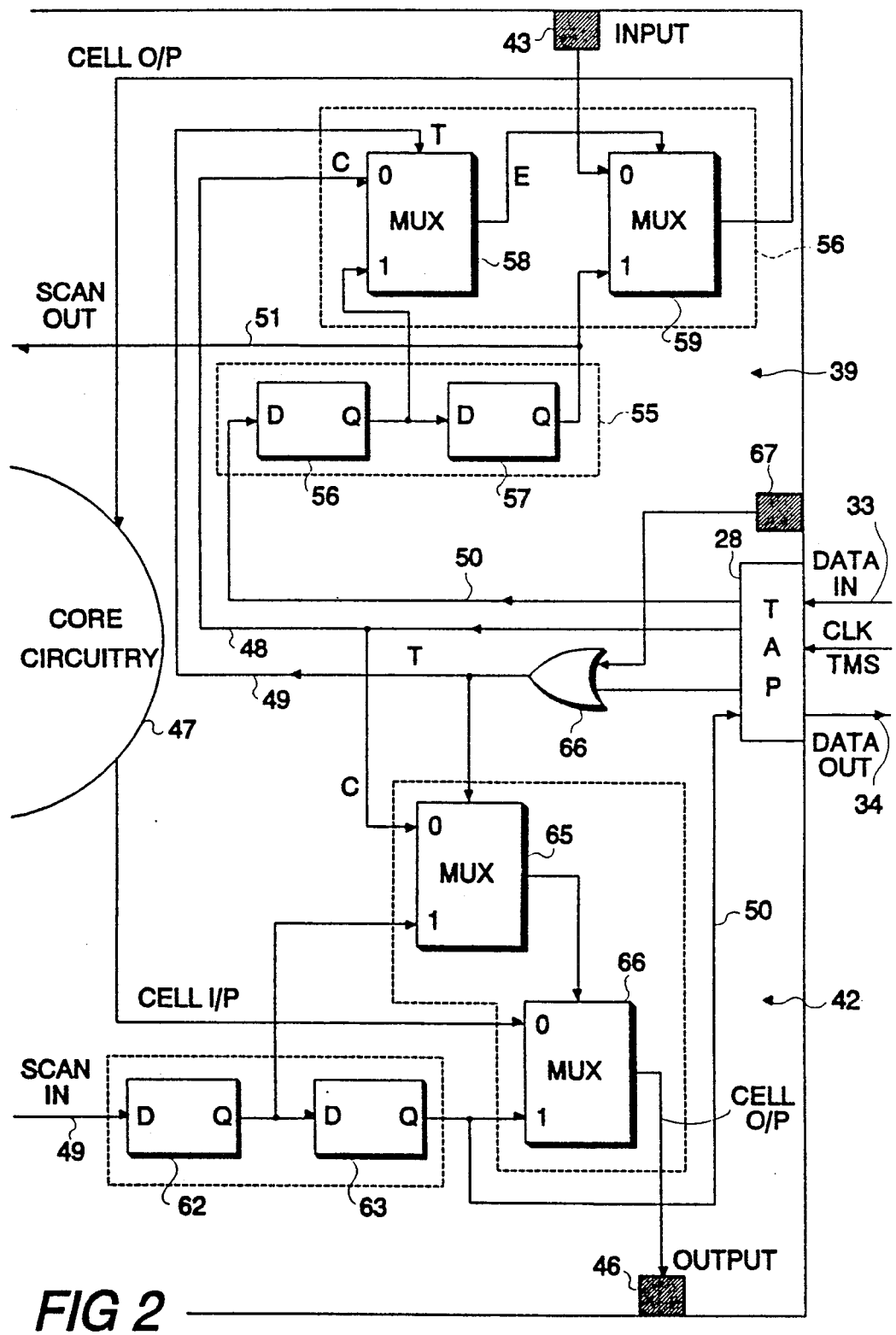
FIG. 2 illustrates the boundary scan components of one of the integrated circuit in more detail.

Referring now to FIG. 2, which shows portions of input scan cell 39 and output scan cell 42 in more detail, input scan cell 39 comprises storage means 55 in the form of D type flip-flop cells 56 and 57, respectively. Serial bus segment 50 connects a "scan-in" port of TAP interface 28 to the input of flip-flop cell 56, the output of which is connected in common to the input of flip-flop cell 57 and one input of a multiplexer 58 which serves as a selector switch. The other input of multiplexer 58 is connected to the control signal bus 48 and the control input of multiplexer 58 is connected to the trigger signal bus 49. The output of multiplexer 58 controls a second multiplexer 59 which has inputs connected to input pad 43 and the output of flip-flop cell 57, respectively. The output of multiplexer 59 is connected to core circuitry 47 and the output of flip-flop cell 57 is connected to serial scan bus segment 51 to relay the scan signal to the next scan cell in the chain. The multiplexers 58 and 59 serve as selectors for selecting either a normal mode of operation, in which the data from input pad 43 passes to the core circuitry 47, or a test mode in which the faulty data in flip-flop 57 is applied to the core circuitry 47.

As mentioned previously, output scan cell 42 is virtually identical in construction to input scan cell 39. Thus output scan cell 42 comprises flip-flop cells 62 and 63 corresponding to flip-flop cells 56 and 57, and multiplexers 65 and 66 corresponding to multiplexers 58 and 59, respectively. These components of output scan cell 42 are interconnected in the same manner as the corresponding components of scan cell 39, but the input and output connections are transposed. Thus, the core circuitry 47 is connected to an input of multiplexer 66 and output pad 46 is connected to the output of multiplexer 66.

In operation, when the integrated circuit 14 is functioning normally, test bus controller 23, under the control of microprocessor 15, maintains both the digital control signal C and the trigger signal T low. Consequently the secondary control signal E applied to multiplexer 59 is low and multiplexer 59 routes the data signal from input pad 43 to the core circuitry 47.

When it is desired to test the diagnostic and maintenance software, test bus controller 23 shifts a serial data instruction sequence, using the IEEE 1149.1 protocol, into all of the TAP interfaces 25-28. The instruction sequence enables access to the boundary scan insertion register chain 38. The control bits C and trigger bits T included in this instruction sequence will be set to zero. Other bits will serve other functions which need not be considered here. If any of the integrated circuits 11-14 are not to have faults applied to them, the controller 23 commands the TAP interfaces of those integrated circuits to bypass them. They do so by connecting the scan-in port to the scan-out port through a bypass register.

Next, and again in accordance with the IEEE protocol, the test bus controller 23 shifts the serial boundary register data sequence, i.e. the binary vector, into the scan chains 35-38 of the selected ones of integrated circuits 11-14. This binary vector is shifted into the chains of scan cells 35-38 by way of the serial scan bus segments 30-34. It should be noted that while the instruction sequence and the binary vector are being inserted in this way, the system is operating in its normal manner. The data loaded into flip-flop cells 56 and 62, respectively, can be considered to be fault insertion "enable" bits. When the "enable" bit is high, it enables a fault to be applied to the associated pad. Conversely, when the "enable" bit is low there will be no fault applied to the associated pad. The data loaded into flip-flop cell 57 will be the actual fault data value to be applied to the core circuitry 47. Likewise, the data loaded into flip-flop cell 63 will appear as faulty data at output pad 46.

The binary vector is loaded into the scan chain so that, in each scan cell which is to apply a fault, flip-flop 62 will hold a logic one value as the "fault enable" bit and flip-flop 63 will contain the faulty data to be applied to the output pad. Likewise, in each input scan cell which is to apply a fault, flip-flop 56 will hold a logic one as a "fault enable" and flip-flop 57 will hold the faulty data to be applied to the core circuitry.

The test bus controller 23 then shifts a second serial data instruction sequence into the scan chains. This second instruction sequence will assert the trigger signal T in the selected integrated circuits, causing the associated faulty data to be inserted. Thus, in each input scan cell which contains a logic one in its flip-flop 56, multiplexers 58 and 59 will both switch. As a result, the corresponding output to the core circuitry 47 will take on the logic value in flip-flop cell 57, regardless of the data which would normally appear at that point. Likewise, in each output scan cell which has a logic one in flip-flop 62, the output pin will assume the logic value in flip-flop 63, regardless of the data which would normally appear at that point.

Assuming that the diagnostic and maintenance software detects the faults and takes appropriate action, the test bus controller 23 then resets the system to its normal operating mode by shifting yet another instruction sequence into the instruction registers of all of the TAP interfaces 25-28 to clear the trigger signal. Alternatively, a TAP reset facility may be invoked.

Trigger signal T may be a signal controlled from the test access interface 28 or it may be applied by way of a separate terminal. Thus, in FIG. 2, an OR gate 66 has its output connected to trigger signal bus 49 and one of its two inputs connected to the TAP interface 28 to receive the trigger signal. The other input of the OR gate 66 is connected to an input pad 67 for application of a separate, external trigger signal. It will be appreciated that additional wiring will be required to provide external access to the input pad 67. An advantage of such a separate trigger input is that it allows more precise control when simulating intermittent faults, which can be emulated by toggling trigger signal T high and low.

Figure 3:
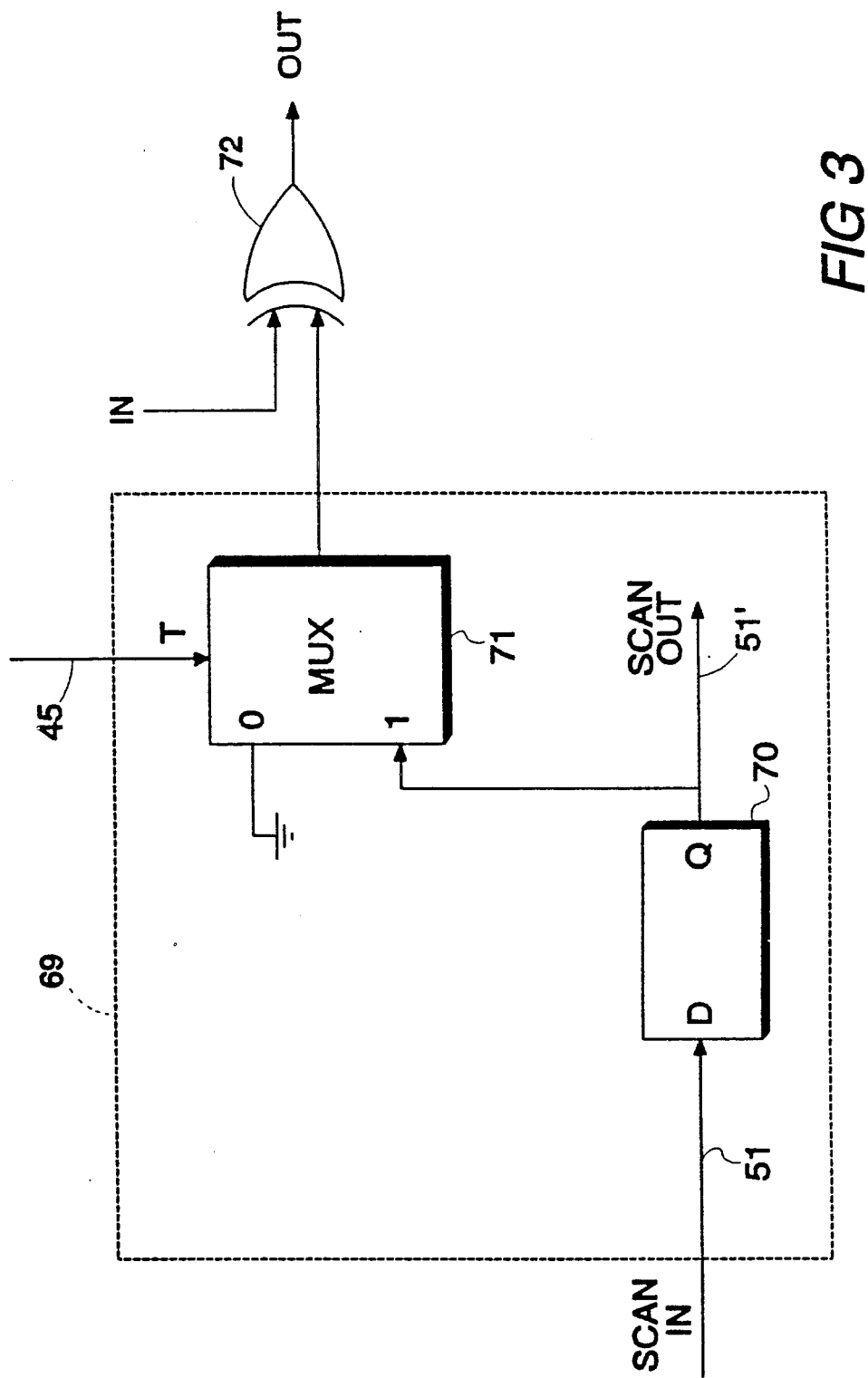
FIG. 3 is a detail view of a modified scan cell.

The invention comprehends various modifications of the above-described specific embodiment. For example, scan cell circuits similar to input scan cell 39, but minus flip-flop cell 57 and multiplexer 58, may be included in the scan chain 38, as indicated at 69 in FIG. 1, and used to insert faults at arbitrary points within the core circuitry 47. Such a modified scan cell 69 is shown in FIG. 3 to comprise a flip-flop 70 connected between serial bus segments 51 and 51', respectively. The output of flip-flop 70 is applied to one input of a multiplexer 71, the other input of which is grounded. The multiplexer 71 is controlled by the trigger signal T by way of the trigger signal bus 49 (see also FIGS. 1 and 2) and has its output connected to one input of an exclusive-OR gate 72. The other input of the exclusive-OR gate 72 is connected into the core circuitry to receive input data and its output is connected to a point in the core circuitry 47 to which this data would normally be conveyed. In effect, this inserts exclusive-OR gate 72 into the data path to which a fault is to be applied.

In use, the enable bit is stored in flip-flop cell 70 and applied when control signal T is high. Toggling of the multiplexer 71 would selectively invert the data and apply that as a fault to the core circuitry. Other kinds of faults could be applied by substituting alternative circuitry for exclusive-OR gate 72.

In the described embodiment, the boundary scan chain 35-38 are each twice the length of a conventional boundary scan chain. If preferred, however, the boundary scan flip-flops could be connected in two separate shift register chains, one for the "fault enable" and the other for the "fault data" bits. Then flip-flops 56 and 57, for example, would not be in series with each other but rather would be in separate chains.

An advantage of embodiments of the present invention is that they make use of boundary scan hardware which would be provided for testing hardware. Because the extra logic is inserted only in logic paths already devoted to test functions, it does not directly affect normal performance of the integrated circuit.

Another advantage of embodiments of the present invention is that faults can be applied to selected ones of the integrated circuit's terminal pads. Indeed, if desired, a single fault could be applied.

We claim:

1. An integrated circuit comprising a test interface, a plurality of terminal pads, a corresponding plurality of scan cells each connected to a respective one of said plurality of terminal pads, and core circuitry, each scan cell comprising:
   (i) an input and an output connected one to a terminal pad of said integrated circuit and the other to said core circuitry of said integrated circuit;
   (ii) storage means for storing a pair of binary bits, one of said pair of binary bits comprising faulty data to be applied to said output of said scan cell, the other of said pair of binary bits serving to control application of said one of said pair of binary bits, said storage means being connected, in series with the corresponding storage means of the remainder of said plurality of scan cells, between an input port and an output port of said test interface, said test interface comprising means for loading a binary vector into said series of storage means; and
   (iii) selector means responsive to a control signal (C), a trigger signal (T) and said other of said pair of bits for selectively connecting either of said input of said scan cell and the output of said storage means to said output of said scan cell, the arrangement being such that application of said faulty data to said scan cell output is dependent upon the state of said other of said pair of bits.

2. An integrated circuit as claimed in claim 1, wherein said storage means comprises a first storage device connected in series with a second storage device, said second storage device serving to store a faulty data bit and said first storage device serving to store a binary bit for controlling application of said faulty data bit.

3. An integrated circuit as claimed in claim 1, wherein said storage means comprises a first storage device and a second storage device connected in series and said selector means comprises a first selector and a second selector, said first selector being operable in response to said trigger signal to apply either of said control signal and the output of said first storage device to control said second selector, said second selector being operable in response to the output of said first selector to select either of said scan cell input and the output of said second storage device for application of said faulty data to said output of said scan cell.

4. An integrated circuit as claimed in claim 1, wherein said input and said output of said scan cell are connected to an input terminal pad and said core circuitry, respectively, of said integrated circuit.

5. An integrated circuit as claimed in claim 1, wherein said input and said output of said scan cell are connected to said core circuitry and an input terminal pad, respectively, of said integrated circuit.

6. An integrated circuit as claimed in claim 1, further comprising OR-gating means having one input connected to said test interface to receive said trigger signal, a second input connected to a test input terminal of said integrated circuit and its output connected to said selector means.

7. An integrated circuit as claimed in claim 1, further comprising, in series with said storage means of said scan cells, a further storage device, the output of said further storage device being coupled to one input of a further selector means, said further selector means having a second input grounded, its output connected to circuitry for controlling application of a fault, and its control input coupled to said test interface for reception of said trigger signal.

8. An integrated circuit as claimed in claim 7, wherein said circuitry comprises exclusive-OR gating means having one input connected to the output of said further selector means and its other input and its output connected in series with a data path to which the fault is to be applied.

9. A system comprising at least one integrated circuit comprising a test interface, a plurality of terminal pads, a corresponding plurality of scan cells each connected to a respective one of said plurality of terminal pads, and core circuitry, said scan cells being connected in series between a scan input port and a scan output port of said test interface, said test interface being operable to load a binary vector into selected ones of the series-connected scan cells, bits of said binary reference vector comprising, alternately, faulty data bits and enabling bits for controlling application of said faulty data by a said scan cell, said system further comprising controller means for controlling said test interface to provide a control signal and a trigger signal, each scan cell comprising:
   (i) an input and an output connected one to a terminal pad of said integrated circuit and the other to core circuitry of said integrated circuit;
   (ii) storage means, connected in series with corresponding storage means of other scan cells, for storing a pair of bits of said binary vector, one of said pair of bits comprising a said faulty data bit and the other of said pair of bits comprising a said enabling bit; and
   (iii) selector means responsive to said control signal (C), said trigger signal (T) and the other of said pair of bits for selectively connecting either said input of said scan cell or said storage means to said output of said scan cell, the arrangement being such that said faulty data bit is applied as the output of said scan cell in dependence upon the state of said other of said pair of bits.

10. A system as claimed in claim 9, wherein said storage means comprises a first storage device connected in series with a second storage device, said second storage device serving to store a faulty data bit and said first storage device serving to store a binary bit for controlling application of said faulty data bit.

11. A system as claimed in claim 9, wherein said storage means comprises first and second storage devices connected in series between a scan input and a scan output of said test interface, and said selector means comprises a first selector and a second selector, said first selector being operable to apply either of said control signal and the output of said first storage device to control said second selector, said second selector being operable to select either of said scan cell input and the output of said second storage device for application of said faulty data to said output of said scan cell.

12. A system as claimed in claim 9, wherein said input and said output of said scan cell are connected to an input terminal pad and said core circuitry, respectively, of said integrated circuit.

13. A system as claimed in claim 9, wherein said input and said output of said scan cell are connected to said core circuitry and an output terminal pad, respectively, of said integrated circuit.

14. A system as claimed in claim 9, wherein said integrated circuit further comprises OR-gating means having one input connected to said interface to receive said control signal, a second input connected to an input terminal of said integrated circuit and an output connected to said selector means.

15. A system as claimed in claim 9, wherein said integrated circuit comprises a further storage device in series with said storage means of said scan cells, the output of said further storage device being coupled to one input of a further selector means, said further selector means having a second input grounded, its output connected to a point in the core circuitry to which a fault is to be applied, and its control input coupled to said test interface for reception of said trigger signal.

16. A system as claimed in claim 15, further comprising exclusive-OR gating means having one input connected to the output of said further selector means and its other input and its output connected in series with a data path to which the fault is to be applied.

17. A system as claimed in claim 9, further comprising means for diagnosing faults arising from said application of said faulty data bits.

18. A system as claimed in claim 17, wherein said storage means comprises a first storage device connected in series with a second storage device, said second storage device serving to store a faulty data bit and said first storage device serving to store a binary bit for controlling application of said faulty data bit.

19. A system as claimed in claim 17, wherein said storage means comprises first and second storage devices connected in series between a scan input and a scan output of said test interface, and said selector means comprises a first selector and a second selector, said first selector being operable to apply either of said control signal and the output of said first storage device to control said second selector, said second selector being operable to select either of said scan cell input and the output of said second storage device for application of said faulty data to said output of said scan cell.

20. A system as claimed in claim 17, wherein said input and said output of said scan cell are connected to an input terminal pad and said core circuitry, respectively, of said integrated circuit.

21. A system as claimed in claim 17, wherein said input and said output of said scan cell are connected to said core circuitry and an output terminal pad, respectively, of said integrated circuit.

22. A system as claimed in claim 17, wherein said integrated circuit further comprises OR-gating means having one input connected to said interface to receive said control signal, a second input connected to an input terminal of said integrated circuit and an output connected to said selector means.

23. A system as claimed in claim 17, wherein said integrated circuit comprises a further storage device in series with said storage means of said scan cells, the output of said further storage device being coupled to one input of a further selector means, said further selector means having a second input grounded, its output connected to a point in the core circuitry to which a fault is to be applied, and its control input coupled to said test interface for reception of said trigger signal.

24. A system as claimed in claim 23, further comprising exclusive-OR gating means having one input connected to the output of said further selector means and its other input and its output connected in series with a data path to which the fault is to be applied.

25. A method of testing an integrated circuit comprising a test interface, a plurality of terminal pads, a corresponding plurality of scan cells, and core circuitry, said test interface being operable to load a binary vector into selected ones of said plurality of scan cells, each scan cell comprising an input and an output connected one to a respective one of said plurality of terminal pads and the other to core circuitry of said integrated circuit, storage means for storing a pair of said bits of a binary vector, and selector means for selectively connecting either of said input of said scan cell and the output of said storage means to said output of said scan cell, the storage means of said plurality of scan cells being connected in series between a scan input port and a scan output port of said test interface, said method comprising the steps of:

(i) loading a binary vector into said series of storage means such that each storage means holds a pair of bits, one bit comprising faulty data and the other bit comprising an enabling bit, applying a trigger singnal to said selector means to initiate application of said faulty data bit ot the output of said scan cell in dependence upon the state of said other bit of said pair of bits.

26. A method as claimed in claim 25, wherein said storage means comprises a first storage device and a second storage device connected in series, and said binary vector is loaded so that said enabling bit is in said first storage device and said faulty data bit is in said second storage device.

27. A method as claimed in claim 26, wherein said selector means comprises a first selector and a second selector, and said step of applying said trigger signal includes applying said trigger signal to said first selector, whereby the output of said first storage device is applied to said second selector to select the output of said second storage device for application of said faulty data to said output of said scan cell.

28. A method as claimed in claim 26, wherein said input and said output of said scan cell are connected to an input terminal pad and said core circuitry, respectively, of said integrated circuit.

29. A method as claimed in claim 26, wherein said input and said output of said scan cell are connected to said core circuitry and an output terminal pad, respectively, of said integrated circuit.

30. A method as claimed in claim 26, wherein said control signal is applied to said selector means by way of said test interface.

31. A method as claimed in claim 26, wherein said control signal is applied to said selector means by way of a separate input terminal of the integrated circuit.

32. A method as claimed in claim 26, including the step of applying to said test interface, prior to insertion of said binary vector, an instruction sequence to control loading of the binary vector into the scan cells, after insertion of said binary vector applying a second instruction sequence comprising said control signal and said trigger signal for initiating application of said faulty data bits and, after application of said faulty data bits, applying a third instruction sequence to said test interface to reset said scan cells to pass data between said terminal pad and said core circuitry.

33. A method as claimed in claim 32, including the step of monitoring said integrated circuit for faults arising from application of said faulty data bits before applying said third instruction sequence.

34. A method as claimed in claim 26, including the step of monitoring said integrated circuit for faults arising from application of said faulty data bits.

* * * * *